(12) United States Patent
Min et al.

(10) Patent No.: US 10,461,231 B2
(45) Date of Patent: Oct. 29, 2019

(54) METHOD FOR FABRICATING LED PACKAGE

(71) Applicant: LUMENS CO., LTD., Yongin-si, Gyeonggi-do (KR)

(72) Inventors: Chunki Min, Yongin-si (KR);
Sangkeun Cho, Yongin-si (KR);
Jaeyoon Lim, Yongin-si (KR);
Seunghyun Oh, Yongin-si (KR);
Yungeon Cho, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/969,758

(22) Filed: May 2, 2018

(65) Prior Publication Data

US 2019/0267523 A1 Aug. 29, 2019

(30) Foreign Application Priority Data

Feb. 27, 2018 (KR) .................. 10-2018-0023591
Apr. 2, 2018 (KR) .................. 10-2018-0038233

(51) Int. Cl.
*H01L 33/00* (2010.01)
*H01L 33/60* (2010.01)
*H01L 33/50* (2010.01)

(52) U.S. Cl.
CPC ............ *H01L 33/60* (2013.01); *H01L 33/507* (2013.01); *H01L 2933/0041* (2013.01); *H01L 2933/0058* (2013.01)

(58) Field of Classification Search
CPC ..... H01L 33/60; H01L 33/507; H01L 33/508; H01L 33/52; H01L 33/50; H01L 2933/0041; H01L 2933/0058
See application file for complete search history.

(56) References Cited

U.S. PATENT DOCUMENTS

| 8,461,610 | B2 * | 6/2013 | Ito ........................ H01L 33/60 257/100 |
| 9,012,826 | B2 * | 4/2015 | Wong .................. G01J 1/4257 250/201.1 |
| 9,431,591 | B1 * | 8/2016 | Lin ....................... H01L 33/60 |
| 9,966,514 | B2 * | 5/2018 | Hsu ...................... H01L 33/60 |
| 2011/0309388 | A1 * | 12/2011 | Ito ........................ H01L 33/507 257/89 |

(Continued)

FOREIGN PATENT DOCUMENTS

| JP | 2002-171000 A | 6/2002 |
| JP | 2009-260244 A | 11/2009 |

(Continued)

*Primary Examiner* — Nikolay K Yushin
(74) *Attorney, Agent, or Firm* — Mei & Mark LLP

(57) ABSTRACT

Disclosed is a method for fabricating the light emitting device packages. The method includes: mounting and arranging light emitting device units on a substrate; attaching wavelength converting members to the respective light emitting device units mounted and arranged on the substrate; filling a reflective material between the light emitting device units attached with the wavelength converting members to form a reflective member; and vertically cutting the reflective material such that the reflective material surrounds the individual light emitting device units attached with the wavelength converting members. Also disclosed are light emitting device packages fabricated by the method.

10 Claims, 8 Drawing Sheets

(56) References Cited

U.S. PATENT DOCUMENTS

2013/0168531 A1\* 7/2013 Wong .................... G01J 1/4257
                                                                                                      250/201.1
2017/0005245 A1\* 1/2017 Hsu ........................ H01L 33/60

FOREIGN PATENT DOCUMENTS

| JP | 2015-201665 A | 11/2015 |
|---|---|---|
| JP | 2016-122868 A | 7/2016 |
| JP | 2016-197715 A | 11/2016 |
| JP | 6149487 B | 6/2017 |
| WO | 2013/137356 A | 9/2013 |
| WO | 2017/013869 A1 | 1/2017 |

\* cited by examiner

METHOD FOR FABRICATING LED PACKAGE

BACKGROUND OF THE INVENTION

1. Field of the Invention

The present invention relates to light emitting device packages and methods for fabricating the light emitting device packages. More specifically, the present invention relates to chip scale light emitting device packages that are suitable for use in lighting systems such as automotive headlamps where high brightness is required and can achieve improved light extraction efficiency, and methods for fabricating the light emitting device packages.

2. Description of the Related Art

Light emitting diodes (LEDs) are semiconductor devices that can emit light of various colors based on PN junction. LEDs have long lifetime, can be reduced in size and weight, and can be operated at low voltage.

LEDs are highly resistant to impact and vibration, do not require a complicated operation procedure, and can be mounted and packaged in various forms on substrates or lead frames. Due to these advantages, LEDs can be modularized to manufacture lighting systems or backlight units for displays.

Light emitting device packages are also provided as chip scale packages (CSPs). Such chip scale packages can be fabricated by coating LEDs with a light-transmitting material so as to surround the side and top surfaces of LEDs. The bottom surfaces of the LEDs of the chip scale packages are usually exposed, enabling direct bonding of electrode pads of the LEDs to substrates.

However, reflectors are not provided in general chip scale packages, making it difficult to guide light emitted from LEDs in an intended direction with an appropriate brightness. In an attempt to overcome this difficulty, a proposal has been made on a method for fabricating chip scale packages including downwardly open reflectors surrounding light emitting devices. However, light between the side surfaces of the LEDs and the inner side surfaces of the reflectors leaks through the bottom surfaces of the LEDs. This light leakage causes low brightness of the chip scale packages.

FIG. 1 illustrates an exemplary conventional chip scale package. The chip scale package illustrated in FIG. 1 is fabricated by mounting an LED 11 on a substrate 12, attaching a phosphor sheet 13 to the LED 11, and dispensing white silicone 14. As illustrated in FIG. 1, the side surfaces of the LED 11 are surrounded by the white silicone. Particularly, the vertical reflection planes of the white silicone 14 prevent light emitted through the side surfaces of the LED 11 from escaping to the outside and the side surfaces 15 of the white silicone 14 reflect the light (see arrows in FIG. 1), with the result that the light is lost, causing an overall reduction in the brightness of the chip scale package. In the structure of the conventional chip scale package, light emitted through the side surfaces of the LED does not propagate forward (i.e. upward from the LED 11 in FIG. 1) and does not travel through the phosphor sheet. Thus, there is also a need to allow light emitted through the side surfaces to propagate forward for higher brightness of the chip scale package. Particularly, chip scale packages for use in automotive headlamps or other front lighting systems are required to have improved brightness of forward propagating light. Thus, such conventional chip scale packages need to be structurally modified.

For the purpose of preventing the brightness of light emitting device packages from deteriorating, reflective walls may be formed by introducing a reflective white resin into cavities of reflectors through top openings of the reflectors. However, the top openings are small in size, making it substantially impossible to secure spaces through which the resin can be introduced. Another problem is that the white resin may contaminate the upper surfaces of the light emitting devices, causing a reduction in luminous efficiency. These problems also need to be solved.

SUMMARY OF THE INVENTION

The present invention has been made in view of the problems of the prior art, and it is one object of the present invention to provide light emitting device packages in which loss of light emitted through the side surfaces of light emitting devices can be reduced to achieve greatly improved brightness and methods for fabricating the light emitting device packages.

It is another object of the present invention to provide light emitting device packages in which a transparent molding compound is used to effectively emit light output through the side surfaces of light emitting devices and methods for fabricating the light emitting device packages.

A method for fabricating light emitting device packages according to one aspect of the present invention includes: mounting and arranging light emitting device units on a substrate; attaching wavelength converting members to the respective light emitting device units mounted and arranged on the substrate; filling a reflective material between the light emitting device units attached with the wavelength converting members to form a reflective member; and vertically cutting the reflective material such that the reflective material surrounds the individual light emitting device units attached with the wavelength converting members.

In one embodiment, the light emitting device units are formed by arranging a plurality of light emitting devices on a sheet; filling a light-transmitting material between the light emitting devices arranged on the sheet to form a light-transmitting member; and curing the light-transmitting material and obliquely cutting the light-transmitting material relative to the individual light emitting devices such that each of the light emitting device units has one light emitting device and the light-transmitting member.

In one embodiment, the oblique cutting is performed such that the cross sections of the obliquely cut areas of the light-transmitting material are straight planes.

In one embodiment, the distances between the obliquely cut areas of the light-transmitting material and the side surfaces of the light emitting device in each of the light emitting device units decrease downward.

In one embodiment, the oblique cutting is performed such that the cross sections of the obliquely cut areas of the light-transmitting material are downwardly convex planes.

In one embodiment, the oblique cutting is performed such that the light-transmitting material is inclined over its entire region.

In one embodiment, the distances between the light-transmitting material and the side surfaces of the light emitting device in each of the light emitting device units decrease downward.

In one embodiment, the oblique cutting is performed such that the light-transmitting material forms downwardly convex planes over its entire region.

In one embodiment, the oblique cutting is performed such that the lower ends of the light-transmitting material are spaced apart from the side surfaces of the light emitting devices.

In one embodiment, the outer circumference of the wavelength converting member is larger than that of the light emitting device in each of the light emitting device packages.

In one embodiment, the reflective member is made of white silicone.

A light emitting device package according to a further aspect of the present invention includes: a substrate; a light emitting device mounted on the substrate; a reflective member having reflection planes from which light emitted through the side surfaces of the light emitting device is reflected; a light-transmitting member disposed between the side surfaces of the light emitting device and the reflective member and having light-transmitting planes through which light emitted through the side surfaces of the light emitting device is transmitted to the reflection planes of the reflective member and in contact with the reflection planes of the reflective member; and a wavelength converting member converting the wavelengths of light emitted from the light emitting device and light reflected from the reflection planes of the reflective member.

In one embodiment, the distances between at least portions of the light-transmitting planes of the light-transmitting member and the side surfaces of the light emitting device decrease downward.

In one embodiment, at least portions of the light-transmitting planes of the light-transmitting member are downwardly convex.

In one embodiment, the distances between the entire areas of the light-transmitting planes of the light-transmitting member and the side surfaces of the light emitting device decrease downward.

In one embodiment, the entire areas of the light-transmitting planes of the light-transmitting member are straight planes.

In one embodiment, the entire areas of the light-transmitting planes of the light-transmitting member are downwardly convex planes.

In one embodiment, the lower ends of the light-transmitting planes of the light-transmitting member are spaced apart from the side surfaces of the light emitting device.

In one embodiment, the outer circumference of the wavelength converting member is larger than that of the light emitting device.

In one embodiment, the reflective member is made of white silicone.

A method for fabricating light emitting device packages according to another aspect of the present invention includes: attaching a plurality of light emitting devices to one side of a light-transmitting plate to transfer the light emitting devices to the light-transmitting plate; molding the one side of the light-transmitting plate and the side surfaces of the light emitting devices with a transparent molding compound; and obliquely cutting the light-transmitting plate such that the cross sections of the light-transmitting plate have first inclined planes, to form a plurality of unit assemblies, each of which consists of the light-transmitting plate, the light emitting device, and the transparent molding compound, wherein the light-transmitting plate is obliquely cut in directions away from the light emitting device from the one side to the other side thereof.

In one embodiment, the transparent molding compound is coated in a liquid state and is then cured to form second inclined planes between the light emitting devices and the light-transmitting plate.

In one embodiment, the inclination of the first inclined planes of the light-transmitting plate is equal to or greater than that of the second inclined planes of the transparent molding compound.

In one embodiment, the method may further include attaching the other side of the light-transmitting plate of the plurality of unit assemblies to a sheet to transfer the unit assemblies to the sheet after the oblique cutting.

In one embodiment, the method may further include molding the peripheries of the unit assemblies on the sheet with an opaque molding compound.

In one embodiment, the method may further include vertically cutting the opaque molding compound around the unit assemblies and separating the sheet attached to the light-transmitting plate of the unit assemblies after the molding with the opaque molding compound.

In one embodiment, the light-transmitting plate may be obliquely cut such that the first inclined planes have an inclination of 55 to 75° and a lower surface roughness than the critical surface roughness.

In one embodiment, each of the light emitting devices may include electrode pads disposed at the other side thereof and the molding with the opaque molding compound may be performed such that the bottom surfaces of the electrode pads of the light emitting devices are exposed to the outside. The molding with the opaque molding compound may be performed such that the bottom surfaces of the electrode pads lie in the same plane as the bottom surface of the opaque molding compound.

A light emitting device package according to yet another aspect of the present invention includes: a light-transmitting plate obliquely cut such that the cross sections have first inclined planes; a light emitting device attached to one side of the light-transmitting plate; and a transparent molding compound molding the one side of the light-transmitting plate and the side surfaces of the light emitting device and having second inclined planes between the light emitting device and the light-transmitting plate wherein the first inclined planes have a lower roughness than the critical surface roughness.

In one embodiment, the transparent molding compound may be coated in a liquid state and cured to form the second inclined planes between the light emitting device and the light-transmitting plate and the inclination of the first inclined planes of the light-transmitting plate may be equal to or greater than the inclination of the second inclined planes of the transparent molding compound.

In one embodiment, the light emitting device package may further include an opaque molding compound molding the periphery of a unit assembly including the light-transmitting plate, the light emitting device, and the transparent molding compound. The opaque molding compound may be vertically cut after the periphery of the unit assembly is molded, and the vertically cut outer side surfaces may be ground.

In one embodiment, the first inclined planes of the light-transmitting plate may have an inclination of 55 to 75° and a lower surface roughness than the critical surface roughness.

In one embodiment, the light emitting device may include electrode pads disposed at the other surface thereof and having bottom surfaces exposed to the outside. The bottom surfaces of the electrode pads lie in the same plane as the bottom surface of the opaque molding compound.

The light emitting device packages of the present invention have a structure in which light-transmitting planes of a light-transmitting member and reflection planes of a reflective member are inclined. This structure reduces loss of light in the lateral directions from light emitting devices, leading to an improvement in brightness.

In addition, the chip scale packages of the present invention can be widely applied to automotive lighting systems due to their high brightness.

Furthermore, the light emitting device packages of the present invention include transparent silicone coated between light emitting devices and a light-transmitting plate to effectively emit light output from the side surfaces of the light emitting devices. The side surfaces of the light-transmitting plate are inclined at a predetermined angle. This structure can improve the extraction efficiency of light output from the light emitting devices.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Exemplary embodiments of the present invention will now be described with reference to the accompanying drawings. It should be noted that the drawings and embodiments described with reference to the drawings are simplified and illustrated such that those skilled in the art can readily understand the present invention.

As used herein, the terms "light emitting device" and "light emitting device unit" are distinguished from each other. The term "light emitting device unit" is defined as a product obtained by obliquely cutting a combination of a light emitting device with a light-transmitting member.

Figure 1:
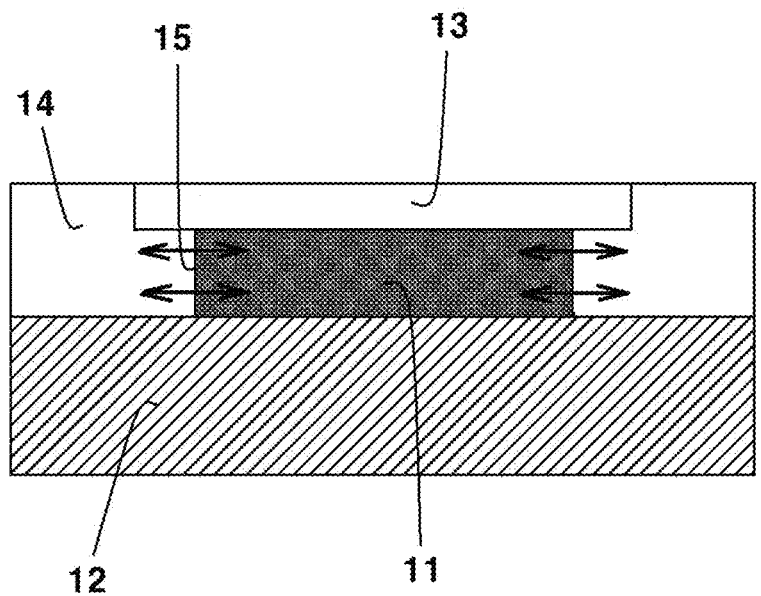
FIG. 1 illustrates an exemplary conventional chip scale package.
Figure 2:
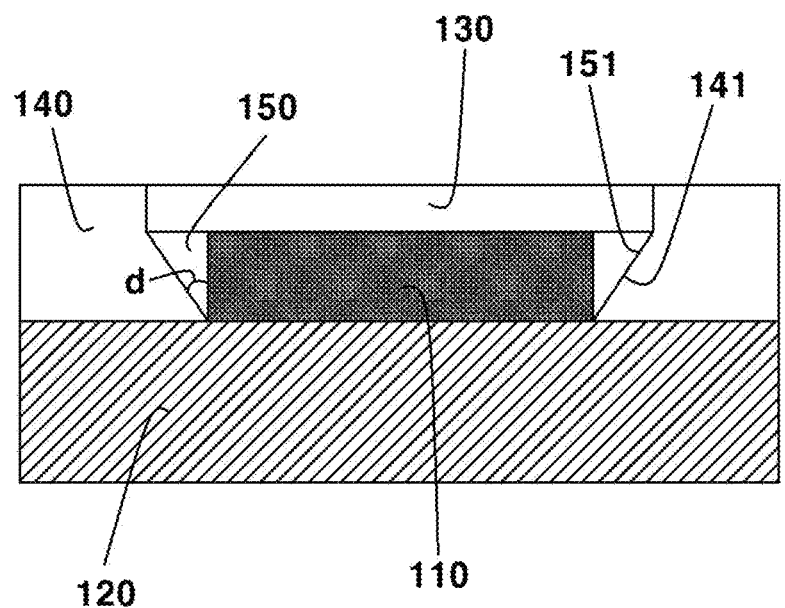
FIG. 2 illustrates a light emitting device package according to one embodiment of the present invention.
Figure 3:
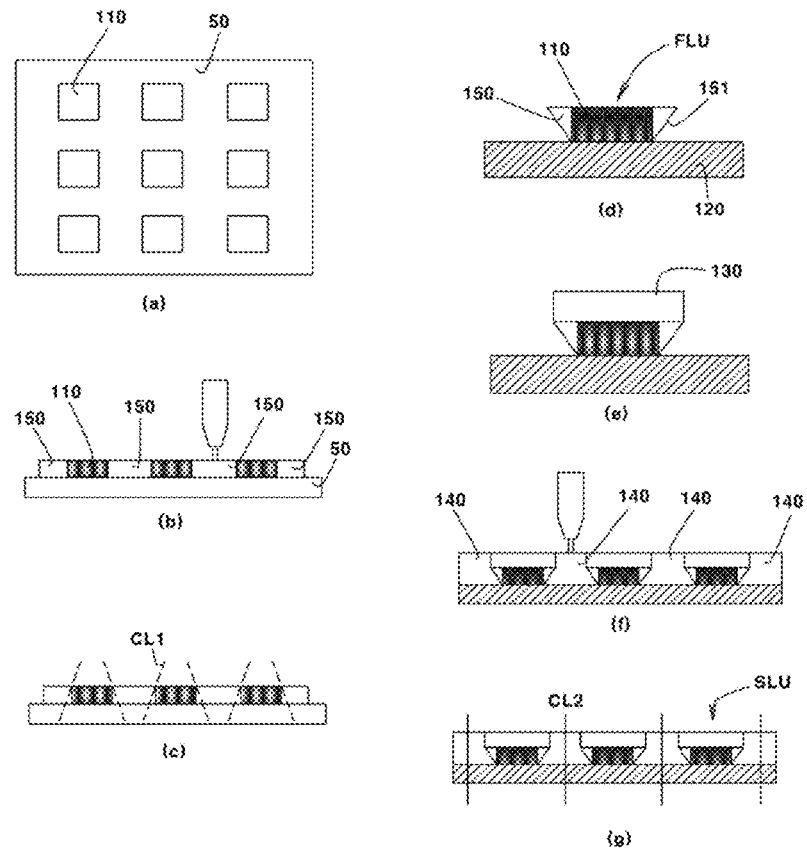
FIG. 3 illustrates views for explaining a method for fabricating light emitting device packages according to one embodiment of the present invention.

FIG. 2 illustrates a light emitting device package according to one embodiment of the present invention, FIG. 3 illustrates views for explaining a method for fabricating light emitting device packages according to one embodiment of the present invention, and FIGS. 4 to 7 illustrates various shapes of light-transmitting members and reflective members of light emitting device packages according to exemplary embodiments of the present invention.

Referring to FIG. 2, a light emitting device package according to one embodiment of the present invention includes a light emitting device 110, a substrate 120, a wavelength converting member 130, a reflective member 140, and a light-transmitting member 150. The light emitting device 110 is in the form of an LED chip. Thus, an LED is exemplified as the light emitting device 110 in the following description.

The LED 110 has a primary surface, side surfaces, and a mounting surface. The LED 110 is mounted on the substrate 120 such that the mounting surface faces the substrate. The primary surface refers to the surface through which the majority of light produced in an active layer of the LED 110 escapes. In FIG. 2, the primary surface is the top surface of the LED 110 that is in contact with the wavelength converting member 130. The side surfaces of the LED 110 are in contact with the light-transmitting member 150. Electrode pads (not illustrated) are disposed on the mounting surface. Accordingly, the LED 110 may be of a flip or lateral type in which an anode pad and a cathode pad are disposed on the mounting surface.

The substrate 120 provides a space in which the LED 110 is mounted. The substrate 120 includes a lead frame that is electrically connected to the electrode pads of the LED 110 for connection with the outside. The lead frame type substrate 120 is preferably made of a highly thermally conductive material.

The wavelength converting member 130 functions to convert the wavelength of light emitted from the LED 110 and is bonded to the primary surface of the LED 110 with a silicone adhesive. The wavelength converting member 130 also converts the wavelength of light emitted through the side surfaces of the LED 110 and reflected from reflection planes 141 of the reflective member 140. The light reflected from the reflection planes 141 may be emitted to areas other than the primary surface of the LED 110. Thus, the wavelength converting member 130 is preferably designed to have a larger outer circumference than the LED 110. Due to this design, the wavelength of light reflected from the reflection planes 141 can be converted. Here, the outer circumference of the LED 110 means that of the primary surface of the LED 110. If the outer circumference of the wavelength converting member 130 is smaller than that of the primary surface of the LED 110, the wavelength of light reflected from the reflection planes 141 cannot be completely converted, for example, with the result that poor color representation is caused after light is transmitted through a secondary wide-angle lens.

Taking into consideration the paths of light reflected from the reflection planes 141, it is most preferred that the outer circumference of the wavelength converting member 130 coincides with that of the light-transmitting member 150. Examples of materials for the wavelength converting member 130 include, but are not limited to, phosphor sheets, quantum dot materials, phosphors-in-glass (PIGs), phosphors-in-silicon (PISs), and phosphor ceramics (PCs). PIG is a material produced by mixing a glass powder with a phosphor powder and molding the mixture into a plate. PIS is a material produced by mixing a phosphor powder with a molding compound and forming the mixture into a film with a thickness of several micrometers. PC is a ceramic plate phosphor produced by powder sintering.

At least portions of the reflection planes 141 are inclined relative to the corresponding side surfaces of the LED 110 so that the reflection planes 141 can reflect light emitted through the side surfaces of the LED 110 and allow the light to enter the wavelength converting member 130 where the wavelength of the light is converted. The reflective member 140 is made of white silicone. However, any material that can ensure good reflection of light emanating from the reflection planes 141 may be used without limitation.

The light-transmitting member 150 is disposed between the side surfaces of the LED 110 and the reflective member 140 to transmit light emitted through the side surfaces of the LED 110 to the reflection planes 141 therethrough. The light-transmitting member 150 has light-transmitting planes 151 in contact with the reflection planes 141 of the reflective member 140.

Specific examples of the light-transmitting member 150 and the reflective member 140 in contact with each other will be described with reference to FIGS. 4 to 7.

Figure 4:
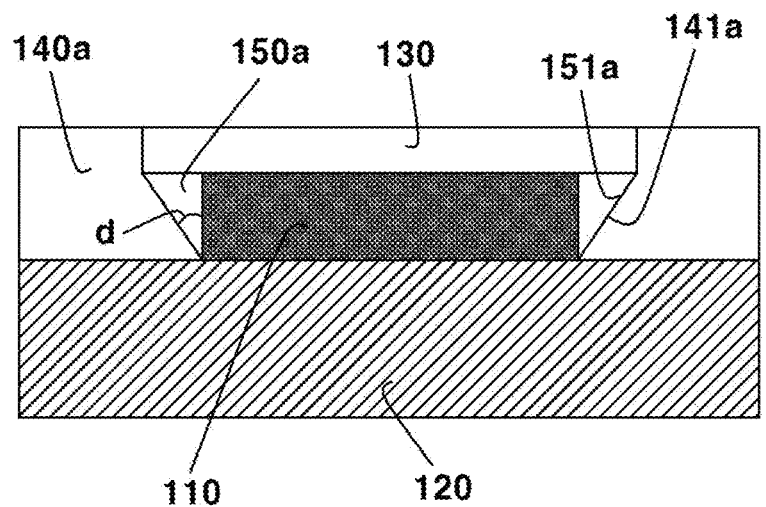
FIGS. 4 to 7 illustrates various shapes of light-transmitting members and reflective members of light emitting device packages according to exemplary embodiments of the present invention.

FIG. 4 illustrates a light-transmitting member 150a having a downward tapered structure. That is, the distances between light-transmitting planes 151a of the light-transmitting member 150a and the side surfaces of an LED 110 decrease downward. Referring to FIG. 4, the thickness of the light-transmitting member 150a has a relatively thick upper portion and a relatively thin lower portion. The entire areas of the light-transmitting planes 151a of the light-transmitting member 150a are straight planes. As used herein, the term "straight plane" refers to a single plane. This term is used to distinguish from curved planes exemplified in FIG. 5. The light-transmitting planes 151a of the light-transmitting member 150a are in contact with reflection planes 141a of a reflective member 140a. With this arrangement, the reflection planes 141a of the reflective member 140a are also straight planes and the distances between the reflection planes 141a of the reflective member 140a and the side surfaces of the LED 110 decrease downward. Thus, light emitted through the side surfaces of the LED 110 passes through the light-transmitting member 150a, is reflected from the reflection planes 141a of the reflective member 140a, and is wavelength converted by a wavelength converting material 130.

Figure 5:
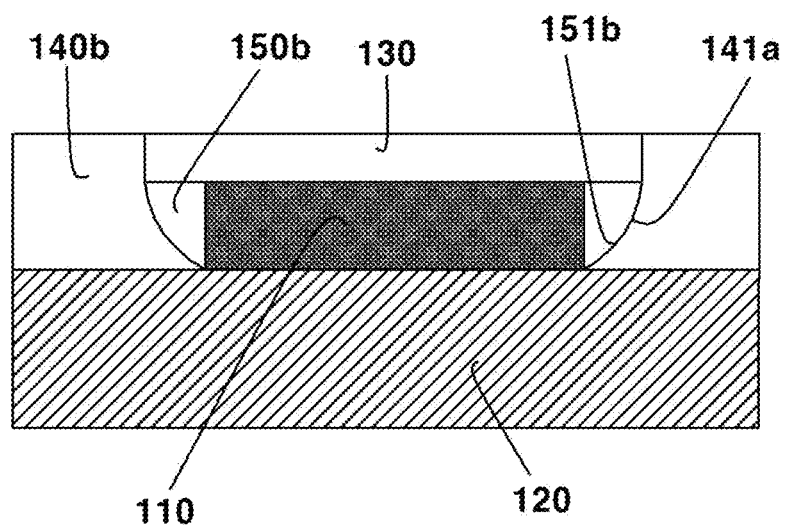

FIG. 5 illustrates another light-transmitting member 150b having a downward tapered structure. The entire areas of light-transmitting planes 151b of the light-transmitting member 150b are downwardly convex planes. Referring to FIG. 5, the entire areas of reflection planes 141b of a reflective member 140b are also downwardly convex planes such that light emitted through the side surfaces of an LED 110 is reflected from the reflection planes 141b and propagates toward a wavelength converting material 130. Similarly to the straight planes illustrated in FIG. 4, the light-transmitting member 150 has a relatively thick upper portion and a relatively thin lower portion. The reflection planes 141b take the shape of concave mirrors. Due to this shape, light emitted through the side surfaces of the LED 110 passes through the light-transmitting member 150b, is reflected from the reflection planes 141b of the reflective member 140b, and is wavelength converted by the wavelength converting material 130.

In the embodiments illustrated in FIGS. 4 and 5, the lower ends of the light-transmitting planes 151a and 151b of the light-transmitting members 150a and 150b are in contact with the side surfaces of the LEDs 110. Alternatively, the lower ends of the light-transmitting planes may be spaced apart from the side surfaces of the LED 110.

Figure 6:
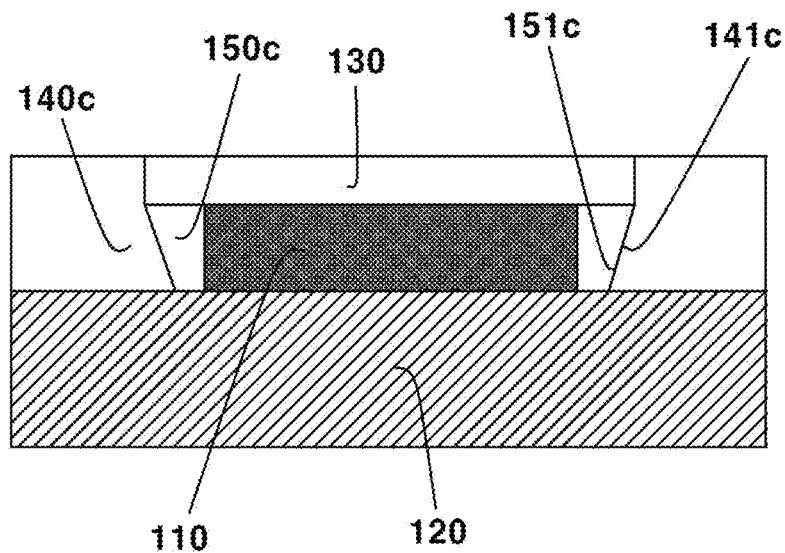

FIG. 6 illustrates another light-transmitting member 150c having a downward tapered structure. The lower ends of light-transmitting planes 151c of the light-transmitting member 150c are spaced apart from the side surfaces of an LED 110 and the distances between the light-transmitting planes 151c of the light-transmitting member 150c and the side surfaces of the LED 110 decrease downward. The light-transmitting planes 151c are formed by oblique cutting of a light-transmitting material relative to the side surfaces of the LED 110, which will be explained in a method for fabricating light emitting device packages with reference to FIG. 3. When the light-transmitting material is cut such that the light-transmitting planes 151c are in contact with the lower ends of the side surfaces of the LED 110, as illustrated in FIG. 4 or 5, there is a danger that the lower ends of the side surfaces of the LED 110 may be damaged. In contrast, when the light-transmitting material is cut such that the lower ends of the light-transmitting planes 151c are spaced apart from the sides surface of the LED 110, as illustrated in FIG. 6, there is no danger of damage to the lower ends of the side surfaces of the LED 110. The light-transmitting member 150c decreases downward in thickness and the entire areas of the light-transmitting planes 151c of the light-transmitting member 150c are straight planes. The light-transmitting planes 151c of the light-transmitting member 150c are in contact with reflection planes 141c of a reflective member 140c. With this arrangement, the reflection planes 141c of the reflective member 140c are also straight planes and the distances between the reflection planes 141c of the reflective member 140c and the side surfaces of the LED 110 decrease downward. Moreover, since the light-transmitting planes 151c of the light-transmitting member 150c are spaced apart from the side surfaces of the LED 110, the reflection planes 141c of the reflective member 140c are also spaced apart from the side surfaces of the LED 110. Due to this shape, light emitted through the side surfaces of the LED 110 passes through the light-transmitting member 150c, is reflected from the reflection planes 141c of the reflective member 140c, and is wavelength converted by a wavelength converting material 130.

Figure 7:
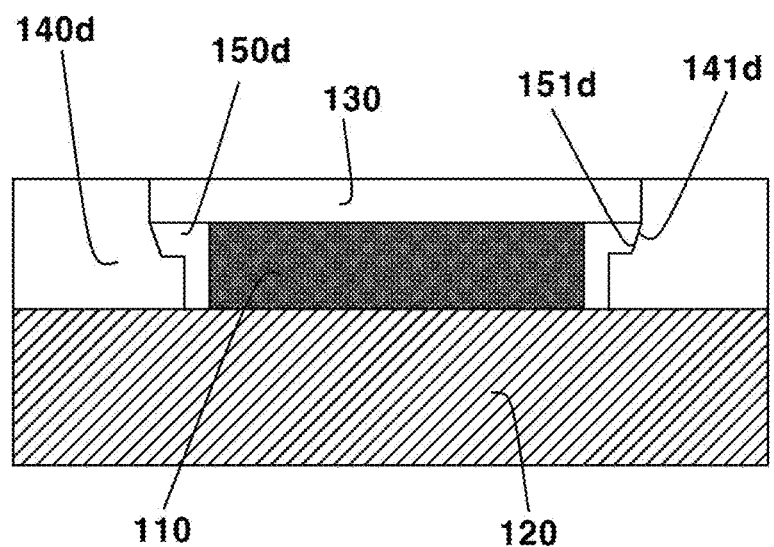

FIG. 7 illustrates a light-transmitting member 150d whose light-transmitting planes 151d are partially inclined relative to the side surfaces of an LED 110. That is, portions of the light-transmitting planes 151d of the light-transmitting member 150d are inclined relative to the side surfaces of the LED 110, unlike in the embodiments of FIGS. 4, 5, and 6 in which the entire areas of the light-transmitting planes of the light-transmitting members and the reflection planes of the reflective members in contact with each other are straight or curved planes inclined relative to the side surfaces of the LEDs. Since reflection planes 141d of a reflective member 140d are in contact with the light-transmitting planes 151d of the light-transmitting member 150d, portions of the reflection planes 141d of the reflective member 140d are also inclined relative to the side surfaces of the LED 110. The formation of the reflection planes 141d and the light-transmitting planes 151d as illustrated in FIG. 7 causes a slight loss of light emitted through the side surfaces of the LED 110 but enables the conversion of the wavelength of light reflected from the reflection planes 141d by the wavelength converting material 130.

Referring next to FIG. 3, an explanation will be given regarding a method for fabricating light emitting device packages according to one embodiment of the present invention. Also in this embodiment, LEDs 110 are exemplified as light emitting devices.

The method begins with the arrangement of a plurality of LEDs 110 on a sheet 50 ((a) of FIG. 3). The sheet 50 may be transparent. The plurality of LEDs 110 are arranged at predetermined intervals on the sheet 50. One surface of each of the LEDs 110 is kept bonded to the sheet 50. For example, the LEDs 110 may be of a flip or lateral type. In this case, electrode pads (not illustrated) are preferably disposed on the surfaces of the LEDs 110 opposite to the surfaces thereof bonded to the sheet. This arrangement protects the electrode pads of the LEDs 110 from contamination. However, the surfaces of the LEDs 110 where electrode pads are disposed may be bonded to the sheet.

Then, a light-transmitting material is filled between the LEDs 110 arranged on the sheet 50 to form a light-transmitting member ((b)). The light-transmitting member 150 of the light emitting device package illustrated in FIG. 2 is formed by cutting the light-transmitting material filled between the LEDs 110. Thus, the light-transmitting material is denoted by the same reference numeral as the light-transmitting member 150 of FIG. 2. The light-transmitting material 150 may be filled between the LEDs 110 by dispensing or squeezing. However, there is no restriction as to the method for filling the light-transmitting material 150.

Then, the light-transmitting material 150 is cured and a plurality of first light emitting device units (FLUs) are formed ((c)). Here, the first light emitting device units (FLUs) are also referred to merely as light emitting device units. As illustrated in (c) of FIG. 3, the first light emitting device units (FLUs) are formed by downwardly cutting the light-transmitting material 150 such that the light-transmitting material 150 surrounds the side surfaces of each of the LEDs 110. Here, the light-transmitting material is cut such that at least portions of the light-transmitting material are inclined relative to each of the centrally disposed LEDs 110. The cut portions of the light-transmitting material become light-transmitting planes (see 151 of FIG. 2) in the final light emitting device packages. Reference numeral CL1 indicates an example of the cutting lines. Each of the first light emitting device units (FLUs) formed as a result of the cutting has one LED 110 and the light-transmitting member 150 having the light-transmitting planes 151 (see FIG. 2). The light-transmitting material 150 may be cut at an inclination of 0°<d<90° (see d of FIG. 2). When only portions of the light-transmitting material 150 are obliquely cut, the inclination d may be the inclination angle of the cut portions of the light-transmitting material. For example, the straight light-transmitting planes 151 (see FIG. 4, 6 or 7) may be obliquely cut at an inclination d in the range of 0°<d<90°. When the light-transmitting planes 151 are curved planes (see FIG. 5), the inclination d is defined as the angle between the tangent to a point on each of the curved light-transmitting planes and the corresponding side surface of the LED 110. At this time, the inclination d of the curved light-transmitting planes 151 may be in the range of 0°<d<90°. Although not specified in the drawing, each of the light-transmitting planes 151 may also consist of several connected straight planes. In each of the first light emitting device units (FLUs), the distance between the obliquely cut area of the light-transmitting material 150 (or the entire area of the light-transmitting plane) and the corresponding side surface of the LED 110 decreases downward.

Then, the first light emitting device units (FLUs) are mounted and rearranged on a substrate 120 ((d)). The first light emitting device units (FLUs) are mounted on the substrate 120 in such a manner that electrode pads (not illustrated) formed on the LEDs of the first light emitting device units (FLUs) are die-bonded to corresponding areas on the substrate 120. The substrate 120 may be, for example, a ceramic substrate with high thermal conductivity. The first light emitting device units (FLUs) are separated from the sheet and are individually mounted on the substrate 120. For mounting of the first light emitting device units, the surfaces of the first light emitting device units opposite to the surfaces thereof bonded to the sheet 50 are placed on the substrate 120, as illustrated in (d) of FIG. 3. That is, when the surfaces of the LEDs 110 opposite to the surfaces thereof on which electrode pads are disposed are bonded to the sheet 50, as in (a) of FIG. 3, the first light emitting device units (FLUs) are inverted for mounting on the substrate 120. Alternatively, the surfaces of the LEDs 110 on which electrode pads are disposed may be bonded to the sheet 50. In this case, the first light emitting device units (FLUs) are separated ((c)) and mounted without being inverted on the substrate 120.

An enlarged view of one of the first light emitting device units (FLUs) is illustrated in (d) of FIG. 3. The substrate 120 may include a lead frame that is electrically connected to the electrode pads of the LED 110 for connection with the outside. The lead frame type substrate 120 is preferably made of a highly thermally conductive material.

Then, a wavelength converting member 130 is attached to each of the first light emitting device units (FLUs) mounted and rearranged on the substrate 120 ((e)). For example, the wavelength converting member 130 is bonded to the primary surface of the LED 110 with a silicone adhesive. Examples of materials for the wavelength converting member 130 include, but are not limited to, phosphor sheets, quantum dot materials, phosphors-in-glass (PIGs), phosphors-in-silicon (PISs), and phosphor ceramics (PCs). The wavelength of light emitted through the side surfaces of the LEDs 110 and reflected from the reflection planes as well as the wavelength of light emitted through the primary surfaces of the LEDs 110 need to be converted. To this end, it is preferred that the outer circumference of the wavelength converting member 130 in each of the first light emitting device units (FLUs) is larger than that of the LED 110. Taking into consideration the paths of light reflected from the reflection planes 141, it is most preferred that the outer circumference of the wavelength converting member 130 coincides with that of the light-transmitting member 150.

Then, a reflective member (140 of FIG. 2) is formed by filling a reflective material between the first light emitting device units (FLUs) attached with the wavelength converting members 130 ((f)). The filled reflective material is cut to proper sizes to separate the first light emitting device units (FLUs). The filled reflective material is formed into the reflective member 140 in each of the first light emitting device units. For convenience, the reflective material is also denoted by reference numeral 140 in (f) of FIG. 3. The reflective material 140 may be filled between the first light emitting device units (FLUs) by dispensing or squeezing. However, there is no restriction as to the method for filling the reflective material 140. The reflective material may be white silicone but is not limited thereto.

Then, the first light emitting device units (FLUs) attached with the wavelength converting members 130 are separated from each other along cutting lines CL2 to form a plurality of second light emitting device units (SLUs) in which the light-transmitting material 150 surrounds the first light emitting device units (FLUs), as illustrated in (f) of FIG. 3. The second light emitting device units (SLUs) are light emitting device packages as final products fabricated by the method of the present invention. Each of the second light emitting device units (SLUs) includes one LED 110, the light-transmitting member 150, the wavelength converting material 130, and the reflective member 140.

Figure 8:
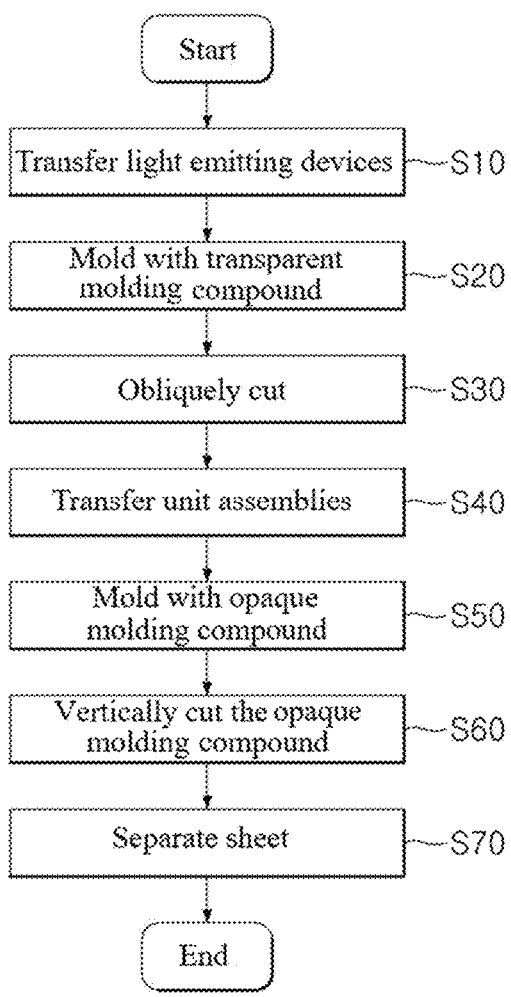
FIG. 8 is a flowchart illustrating a method for fabricating light emitting device packages according to another embodiment of the present invention.
Figure 9:
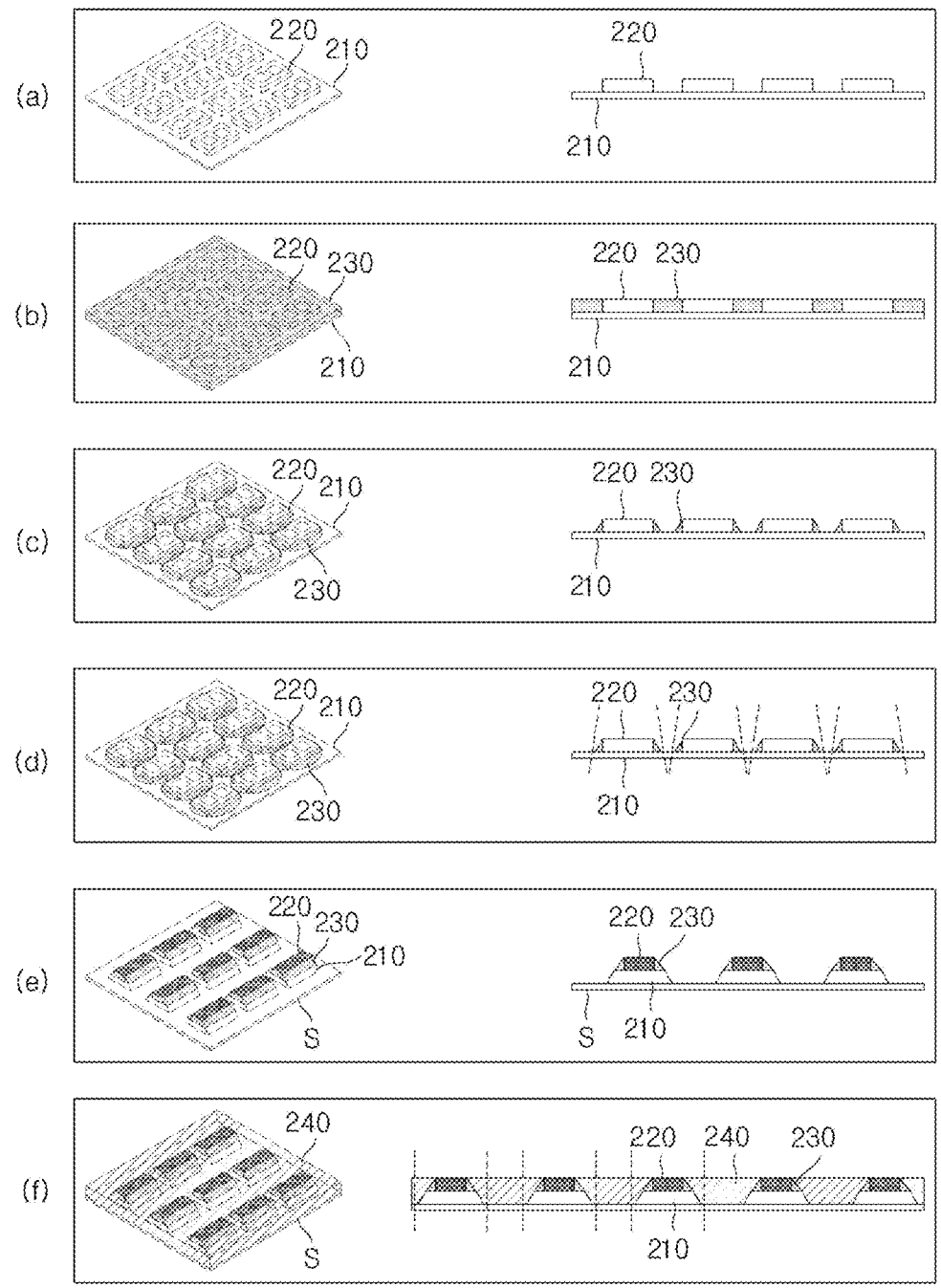
FIG. 9 schematically illustrates a method for fabricating light emitting device packages according to another embodiment of the present invention.

FIG. 8 is a flowchart illustrating a method for fabricating light emitting device packages according to another embodiment of the present invention and FIG. 9 schematically illustrates a method for fabricating light emitting device packages according to another embodiment of the present invention. Light emitting device packages fabricated by the methods may be chip scale packages (CSPs).

The methods for fabricating light emitting device packages will be explained with reference to FIGS. 8 and 9.

In step S10, a plurality of light emitting devices 220 are attached to one side of a light-transmitting plate 210, as illustrated in (a) of FIG. 9. The location of the plurality of light emitting devices 220 on the light-transmitting plate 210 enables simultaneous fabrication of a plurality of light emitting device packages. The light emitting devices 220 can be transferred in a matrix array to the light-transmitting plate 210. The light emitting devices 220 are in the form of flip-chip devices including electrode pads protruding from the surfaces of the light emitting devices 220 opposite to the surfaces thereof attached to the light-transmitting plate 210, as illustrated in (a) of FIG. 9.

Light output from the light emitting devices 220 is emitted to the outside through the light-transmitting plate 210. Examples of suitable materials for the light-transmitting plate 210 include polycarbonate, polysulfone, polyacrylate, polystyrene, polyvinyl chloride, polyvinyl alcohol, polynorbonene, and polyester. Other light-transmitting resins may also be applied to the production of the light-transmitting plate 210.

In step S20, the one side of the light-transmitting plate 210 and the side surfaces of the light emitting devices 220 may be molded with a transparent molding compound. As illustrated in (b) of FIG. 9, the transparent molding compound 230 in the form of a liquid is supplied to the surface of the light emitting devices 220. The transparent liquid molding compound 230 may be supplied in such an amount that it reaches at least the height of the light emitting devices 220. Thereafter, the transparent liquid molding compound 230 is cured, as illustrated in (c) of FIG. 9. The cured transparent molding compound 230 forms second inclined planes while surrounding the light emitting devices 220.

In step S30, the light-transmitting plate 210 is obliquely cut such that the cross sections of the light-transmitting plate 210 have first inclined planes. In this step, the light-transmitting plate 210 may be cut to predetermined areas to separate the light emitting devices 220. As a result, unit assemblies, each of which includes the light emitting device 220, the transparent molding compound 230, and the light-transmitting plate 210, can be formed. The transparent molding compound 230 may not be cut and the inclination of the first inclined planes of the light-transmitting plate 210 may be different from that of the second inclined planes of the transparent molding compound 230. That is, the inclination of the first inclined planes may be equal to or greater than that of the second inclined planes. Burrs may be formed during cutting in step S30. In this case, deburring may be additionally performed.

In step S30, the light-transmitting plate 210 is obliquely cut in directions far away from the light emitting devices 220 attached to the light-transmitting plate 210 from the one side to the other side of the light-transmitting plate 210, as illustrated in (d) of FIG. 9. In an embodiment, the light-transmitting plate 210 may be cut such that the first inclined planes have an inclination of 55 to 75°. In this embodiment, the first inclined planes of the cut light-transmitting plate 210 may have a lower surface roughness than the critical surface roughness.

The surface roughness of the first inclined planes may vary depending on the cross-sectional inclination thereof. The lower the surface roughness, the higher the luminous efficiency of the light emitting devices 220. When the surface roughness of the first inclined planes of the light-transmitting plate 210 increases, the amount of light scattered on the first inclined planes increases, with the result that the amount of light emitted to the outside is reduced, causing loss of luminous efficiency of the light emitting devices 220. Vertical cutting of the light-transmitting plate 210 results in a high surface roughness of the cross sections of the light-transmitting plate 210. In contrast, oblique cutting of the light-transmitting plate 210 at a predetermined angle results in a low surface roughness. The inclination for an optimum surface roughness of the first inclined planes can be determined empirically. In an embodiment, an optimum surface roughness can be obtained when the inclination of the first inclined planes is from 55 to 75°. The inclination of the first inclined planes may vary but is set such that the surface roughness of the first inclined planes is lower than the critical surface roughness. As used herein, the term "critical surface roughness" refers to the surface roughness of the first inclined planes when the light-transmitting plate is cut vertically.

In conclusion, oblique cutting of the light-transmitting plate 210 in step S30 can ensure a low surface roughness of the first inclined planes.

In step S40, the plurality of unit assemblies formed in step S30 are rearranged on a new sheet S, as illustrated in (e) of FIG. 9. Specifically, the other side of the light-transmitting plate is attached to the sheet S to transfer the unit assemblies to the sheet.

Thereafter, in step S50, the peripheries of the unit assemblies are molded with an opaque molding compound. As illustrated in (f) of FIG. 9, the opaque molding compound 240 in the form of a liquid is supplied on the sheet S to such a height that electrode pads of the light emitting devices 220 are not covered with the opaque molding compound 240. In step S50, the opaque liquid molding compound 240 is cured to mold the peripheries of the unit assemblies. The molding with the opaque molding compound 240 may be performed such that the bottom surfaces of the electrode pads of the light emitting devices 220 are exposed to the outside. In an alternative embodiment, the molding with the opaque molding compound may be performed such that the bottom surfaces of the electrode pads lie in the same plane as the bottom surface of the opaque molding compound. That is, in the case where the molding with the opaque molding compound is performed to protect the unit assemblies, the electrode pads are exposed through which the final light emitting device packages are easily electrically connected to other elements such as substrates. Particularly, when the bottom surfaces of the electrode pads lie in the same plane as the bottom surface of the opaque molding compound, stable connection is possible while minimizing the exposure of the electrode pads.

Figure 10:
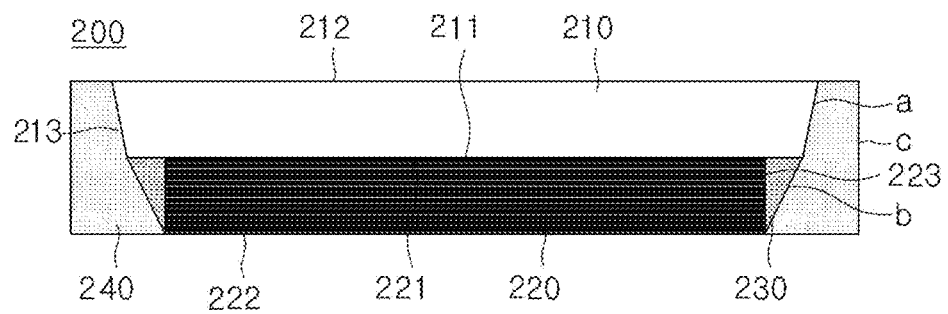
FIG. 10 is a cross-sectional view illustrating a light emitting device package according to another embodiment of the present invention.

After curing of the opaque molding compound, the opaque molding compound can be vertically cut around the unit assemblies in step S60. In step S70, the sheet S is separated from the light-transmitting plate 210 of the unit assemblies. Burrs may be formed during the vertical cutting. In an embodiment, deburring may be additionally performed. FIG. 10 illustrates one of the final light emitting device packages 200. The opaque molding compound 240 can protect the light emitting device package 200 from external impacts. Light output from the light emitting device 220 can be reflected by the opaque molding compound 240 and can be emitted to the outside. That is, the majority of light output from the light emitting device 220 is directly emitted through the light-transmitting plate 210 but a portion of the light may be output through the side surfaces of the light emitting device 220. The light output through the side surfaces of the light emitting device 220 can be reflected by the opaque molding compound 240 and can be emitted to the outside.

FIG. 10 is a cross-sectional view illustrating a light emitting device package according to another embodiment of the present invention.

Referring to FIG. 10, the light emitting device package 200 includes a light-transmitting plate 210, a light emitting device 220, a transparent molding compound 230, and an opaque molding compound 240.

With reference to FIG. 10, an explanation will be given of the light emitting device package.

The light-transmitting plate 210 can protect the light emitting device 220 from external impacts. Light output from the light emitting device 220 can be emitted to the outside through the light-transmitting plate 210. Examples of suitable materials for the light-transmitting plate 210 include polycarbonate, polysulfone, polyacrylate, polystyrene, polyvinyl chloride, polyvinyl alcohol, polynorbonene, and polyester. Other light-transmitting resins may also be applied to the production of the light-transmitting plate 210. The structure of the light-transmitting plate 210 may be modified in various ways. In an embodiment, a micropattern, microprojections or a diffusion film may be formed on the surface of the light-transmitting plate 210. In another embodiment, micropores may be formed in the light-transmitting plate 210.

One side 211 of the light-transmitting plate 210 is larger in area than the other side 212 thereof, as illustrated in FIG. 10. The light-transmitting plate 210 may be obliquely cut such that the cross sections of the light-transmitting plate 210 have first inclined planes a. The inclination of the first inclined planes a may vary. In one embodiment, the inclination of the first inclined planes a may be from 55 to 57°.

The first inclined planes a of the light-transmitting plate 210 may have a lower surface roughness than the critical surface roughness. Light output from the light emitting device 220 is transmitted and emitted to the outside through the light-transmitting plate 210. A portion of the light output from the light emitting device 220 may be emitted through the first inclined planes a of the light-transmitting plate 210. If the surface roughness of the first inclined planes a is high, the amount of light scattered on and reflected outward from the first inclined planes a is reduced, causing loss of luminous efficiency of the light emitting device. Thus, the surface roughness of the first inclined planes a is at least limited to less than the critical surface roughness. In a particular embodiment of the present invention, the surface roughness of the first inclined planes a may be increased by obliquely cutting the light-transmitting plate 210. Generally, the surface roughness of the cross sections of the vertically cut light-transmitting plate 210 is higher than that of the cross sections of the obliquely cut light-transmitting plate 210. The surface roughness of the cross sections of the obliquely cut light-transmitting plate 210 may vary depending on the inclination of the obliquely cut light-transmitting plate. Accordingly, the inclination for an optimum surface roughness can be determined empirically. In an embodiment, an optimum surface roughness can be obtained when the inclination of the first inclined planes a is from 55 to 75°. The inclination of the first inclined planes a may vary but is set such that the surface roughness of the first inclined planes a is lower than the critical surface roughness. As used herein, the term "critical surface roughness" refers to the surface roughness of the first inclined planes when the light-transmitting plate is cut vertically.

One surface 221 of the light emitting device 220 may be attached to the side 211 of the light-transmitting plate 210. Light may be output through the surface 221 of the light emitting device 220. That is, the surface 221 of the light emitting device 220 corresponds to a light-emitting surface. The light emitting device 220 may be in the form of a flip-chip device including electrode pads (not illustrated) protruding from the other surface 222 thereof, as illustrated in FIG. 10.

The light emitting device 220 is composed of semiconductors. For example, the light emitting device 220 may be a blue, green, red or yellow light emitting diode (LED) composed of nitride semiconductors. The nitride semiconductors can be represented by $Al_xGa_yIn_zN$ ($0 \leq x \leq 1$, $0 \leq y \leq 1$, $0 \leq z \leq 1$, $x+y+z=1$). The light emitting device 220 may be fabricated by epitaxial growth of nitride semiconductors on a sapphire or silicon carbide substrate by a vapor phase growth method such as MOCVD. Such nitride semiconductors include InN, AlN, InGaN, AlGaN, and InGaAlN. The light emitting device 220 may be fabricated using other semiconductors such as ZnO, ZnS, ZnSe, SiC, GaP, GaAlAs, and AlInGaP. In this case, the light emitting device 220 may have a laminate structure consisting of an n-type semiconductor layer, a light-emitting layer, and a p-type semiconductor layer formed in this order. The light-emitting layer is an active layer that may be formed using a stacked semiconductor including a multi-quantum well or single quantum well structure or a stacked semiconductor of a double heterostructure.

The side 211 of the light-transmitting plate 210 and the side surfaces 223 of the light emitting device may be molded with the transparent molding compound 230. The transparent molding compound may be applied in a liquid state and may be fixed by curing to form second inclined planes b between the light emitting device 220 and the light-transmitting plate 210.

The transparent molding compound 230 surrounds the side surfaces 222 of the light emitting device 220. This structure ensures the paths of light output from the side surface 223 of the light emitting device 220 and emitted through the transparent molding compound 230. That is, the structure of the transparent molding compound 230 can contribute to an improvement in the luminous efficiency of the light emitting device 220. The inclination of the second inclined planes b of the transparent molding compound may be smaller than or equal to the first inclined planes a of the light-transmitting plate, as illustrated in FIG. 10.

The periphery of a unit assembly including the light-transmitting plate 210, the light emitting device 220, and the transparent molding compound 230 may be molded with the opaque molding compound 240. The opaque molding compound 240 can protect the unit assembly from external impacts and can reflect light output from the light emitting device 220 to emit the light to the outside. The majority of light output from the light emitting device 220 is directly emitted through the light-transmitting plate 210 but a portion of the light may be output through the side surfaces of the light emitting device 220. In this case, the portion of the light output through the side surfaces of the light emitting device 220 can be reflected by the opaque molding compound 240 and can be emitted to the outside.

The opaque molding compound 240 may be an epoxy resin composition, a silicone resin composition, a modified epoxy resin composition such as a silicon modified epoxy resin composition, a modified silicone resin composition such as an epoxy modified silicone resin composition, a polyimide resin composition, a modified polyimide resin composition, polyphthalamide (PPA), a polycarbonate resin, polyphenylene sulfide (PPS), a liquid crystal polymer (LCP), an ABS resin, a phenolic resin, an acrylic resin or a PBT resin, which may optionally contain a light reflective material such as titanium oxide, silicon dioxide, titanium dioxide, zirconium dioxide, potassium titanate, alumina, aluminum nitride, boron nitride, mullite, chromium, or a white or metallic component.

After the periphery of the unit assembly is molded, the opaque molding compound 240 may be vertically cut. In an embodiment, the outer side surfaces c of the vertically cut opaque molding compound 240 may be ground. That is, the surface roughness of the outer side surfaces c can be reduced by grinding, achieving improved perfection of the final light emitting device package 200.

Figure 11:
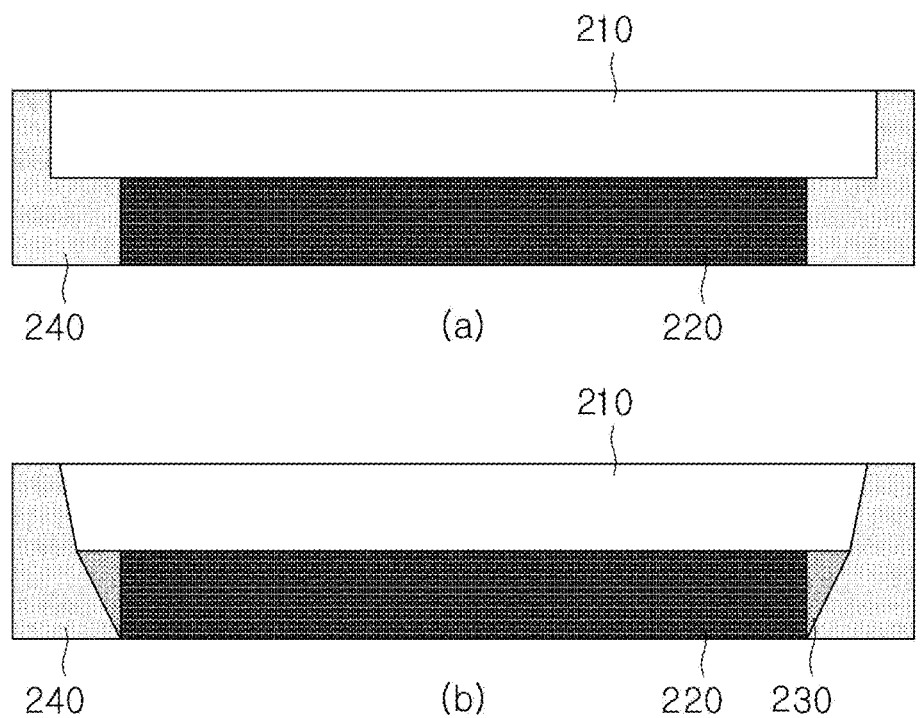
FIGS. 11 to 13 compare light emitting device packages according to exemplary embodiments of the present invention with light emitting device packages of the prior art.
Figure 12:
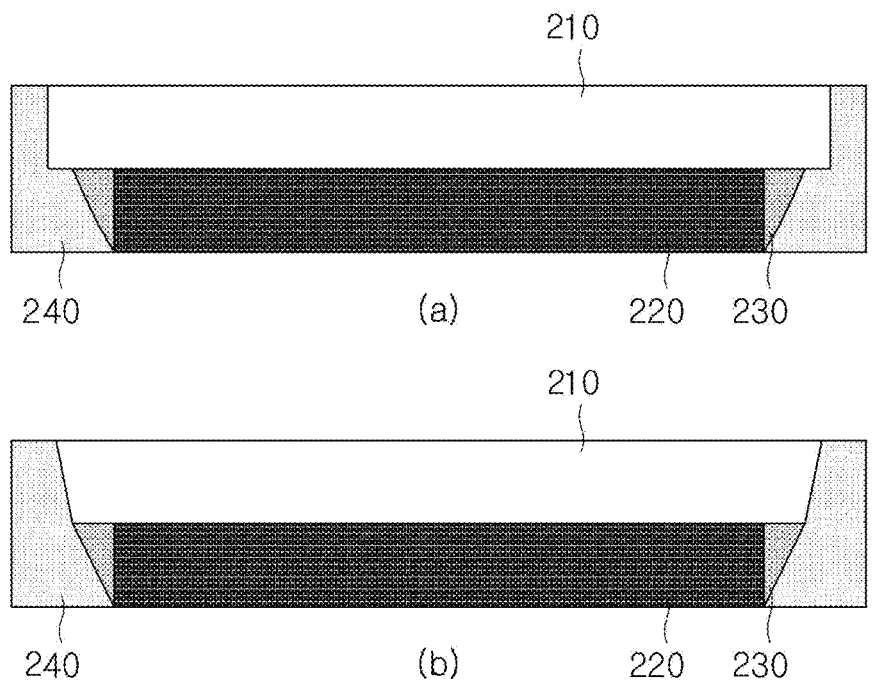
Figure 13:
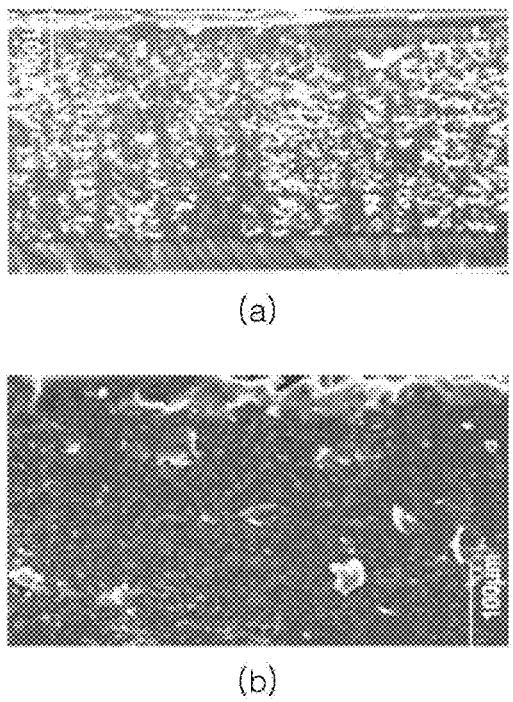

FIGS. 11 to 13 compare light emitting device packages according to exemplary embodiments of the present invention with light emitting device packages of the prior art.

(a) of FIG. 11 illustrates a light emitting device package without a transparent molding compound 230. In this light emitting device package, the majority of light is emitted to the outside through a light-emitting surface of a light emitting device 220 but light output from the side surfaces of the light emitting device 220 is blocked by an opaque molding compound 240 and is not emitted to the outside.

In contrast, (b) of FIG. 11 illustrates a light emitting device package including a transparent molding compound 230. In this light emitting device package, light output from the side surfaces of a light emitting device 220 is transmitted through the transparent molding compound 230 and is irradiated onto an opaque molding compound 240. The presence of second inclined planes of the transparent molding compound 230 facilitates the emission of light reflected by the opaque molding compound 240 to the outside. As a result, the light emitting device package illustrated in (b) of FIG. 11 can achieve a ~5% increase in light extraction efficiency over the light emitting device package illustrated in (a) of FIG. 11.

(a) of FIG. 12 illustrates a light emitting device package including a transparent molding compound 230 and a vertically cut light-transmitting plate 210. (b) of FIG. 12 illustrates a light emitting device package according to one embodiment of the present invention in which a light-transmitting plate 210 is obliquely cut to form first inclined planes.

(a) of FIG. 13 is a cross-sectional image of the vertically cut light-transmitting plate 210 and (b) of FIG. 13 is a cross-sectional image of the obliquely cut light-transmitting plate 210. As illustrated in (a) and (b) of FIG. 13, the surface roughness of the first inclined planes formed by oblique cutting at a predetermined angle is lower than that of the side surfaces of the vertically cut light-transmitting plate 210.

Generally, light output from the light emitting device 220 is transmitted through the light-transmitting plate 210 and is emitted to the outside, and a portion of the light is emitted through the side surfaces of the light-transmitting plate 210. If the side surfaces of the light-transmitting plate 210 are rough, the amount of light scattered on and reflected outward by the side surfaces is reduced, causing loss of luminous efficiency of the light emitting device. Therefore, the light emitting device package illustrated in (b) of FIG. 12 is advantageous in terms of light extraction efficiency due to the low roughness of the side surfaces. That is, the light emitting device package illustrated in (b) of FIG. 12 in which the light-transmitting plate 210 is obliquely cut to form the first inclined planes can achieve a ~1.5% increase in light extraction efficiency over the light emitting device package illustrated in (a) of FIG. 12.

The present invention is not limited to the foregoing embodiments and the accompanying drawings. Those skilled in the art will appreciate that various substitutions, modifications, and changes can be made to the elements of the present invention without departing from the spirit of the present invention.

What is claimed is:

1. A method for fabricating light emitting device packages, comprising:
   preparing light emitting device units formed by arranging a plurality of light emitting devices on a sheet, filling a light transmitting material between the light emitting devices arranged on the sheet to form a light-transmitting member, curing the light-transmitting material, obliquely cutting the light-transmitting material relative to the individual light emitting devices and separating the individual light emitting devices from the sheet;
   mounting and arranging the light emitting device units on a substrate; attaching wavelength converting members to the respective light emitting device units mounted and arranged on the substrate;
   filling a reflective material between the light emitting device units attached with the wavelength converting members to form a reflective member; and
   vertically cutting the reflective material such that the reflective material surrounds the individual light emitting device units attached with the wavelength converting members.

2. The method according to claim 1, wherein the oblique cutting is performed such that the cross sections of the obliquely cut areas of the light-transmitting material are straight planes.

3. The method according to claim 1, wherein the distances between the obliquely cut areas of the light-transmitting material and the side surfaces of the light emitting device in each of the light emitting device units decrease downward.

4. The method according to claim 1, wherein the oblique cutting is performed such that the cross sections of the obliquely cut areas of the light-transmitting material are downwardly convex planes.

5. The method according to claim 1, wherein the oblique cutting is performed such that the light-transmitting material forms downwardly convex planes over its entire region.

6. The method according to claim 1, wherein the outer circumference of the wavelength converting member is larger than that of the light emitting device in each of the light emitting device packages.

7. The method according to claim 1, wherein the reflective member is made of white silicone.

8. The method according to claim 1, wherein the oblique cutting is performed such that the light-transmitting material is inclined over its entire region.

9. The method according to claim 8, wherein the distances between the light-transmitting material and the side surfaces of the light emitting device in each of the light emitting device units decrease downward.

10. The method according to claim 9, wherein the oblique cutting is performed such that the lower ends of the light-transmitting material are spaced apart from the side surfaces of the light emitting devices.

* * * * *